United States Patent
Kobayashi et al.

(10) Patent No.: US 6,562,219 B2
(45) Date of Patent: May 13, 2003

(54) METHOD FOR THE FORMATION OF COPPER WIRING FILMS

(75) Inventors: Akiko Kobayashi, Tokyo (JP); Atsushi Sekiguchi, Tokyo (JP); Tomoaki Koide, Tokyo (JP); Minjuan Zhang, Ann Arbor, MI (US); Hideki Sunayama, Tokyo (JP); Shiqin Xiao, Mie-ken (JP); Kaoru Suzuki, Fuchu (JP)

(73) Assignee: Anelva Corporation, Fuchu (JP)

( * ) Notice: Subject to any disclaimer, the term of this patent is extended or adjusted under 35 U.S.C. 154(b) by 0 days.

(21) Appl. No.: 09/987,940

(22) Filed: Nov. 16, 2001

(65) Prior Publication Data

US 2002/0134686 A1 Sep. 26, 2002

(30) Foreign Application Priority Data

Jan. 22, 2001 (JP) ........................................ 2001-013621

(51) Int. Cl.⁷ ............................. C23C 28/02; C25D 5/50
(52) U.S. Cl. ...................... 205/186; 205/227; 205/228
(58) Field of Search ................................ 205/186, 227, 205/228

(56) References Cited

U.S. PATENT DOCUMENTS 6,242,349 B1 * 6/2001 Nogami et al. ............. 438/687

FOREIGN PATENT DOCUMENTS

| JP | 10-074761 | 3/1998 |
| JP | 10-074762 | 3/1998 |
| JP | 10-074763 | 3/1998 |
| JP | 10-079389 | 3/1998 |
| JP | 10-135504 | 5/1998 |
| JP | 11-186261 | 7/1999 |
| JP | 11-186261 A | * 7/1999 |

OTHER PUBLICATIONS

Sekiguchi et al., "In Situ Chemical Vapor Deposition Manufacturing Processes of Barrier/Copper Seed Films for Electroplating", The Institute of Electronics, Information and Communication Engineers, Technical Report of IEICE, Jan. 2001, pp. 43–50.*

The Institute of Electronics, Information and Communication Engineers; Technical Report of IEICE, Jan. 2001, pp. 43–50 "In Situ Chemical Vapor Deposition Manufacturing Processes of Barrier/Copper Seed Films for Electroplating", Atsushi Sekiguchi et al., (translation of abstract provided).

* cited by examiner

Primary Examiner—Edna Wong
(74) Attorney, Agent, or Firm—Burns, Doane, Swecker & Mathis, L.L.P.

(57) ABSTRACT

A method for the formation of copper wiring films includes the steps of forming a first copper film by a CVD method on a diffusion barrier film, which diffusion barrier film has been formed on a semiconductor substrate and in which a concavity has been established; heating the first copper film to a temperature within the range from 200 to 500° C.; and subsequently forming a second copper film on the first copper film by a plating method using the first copper film as an electrode.

12 Claims, 2 Drawing Sheets

METHOD FOR THE FORMATION OF COPPER WIRING FILMS

CROSS-REFERENCE TO RELATED APPLICATIONS

The present application claims the priority of Japanese Patent Application No. 2001-013621, filed in Japan on Jan. 22, 2001, the entire contents of which is hereby incorporated herein by reference.

DETAILED DESCRIPTION OF THE INVENTION

1. Technical Field of the Invention

The invention concerns a method for the formation of Cu (copper) wiring films where the adhesion of the copper film to a base diffusion barrier film is improved in a method for the formation of copper wiring where a copper film is formed on the diffusion barrier film which has been formed on an insulating film which has been formed on a substrate which is being processed.

2. Discussion of Related Art

Cu (copper) has been used for wiring material for high performance semiconductor devices which have appeared in recent years. This is because Cu has a lower resistance than Al (aluminum) and is more resistant to the phenomena known as stress migration and electro-migration which are dominated by the diffusion behavior of the metal atoms from which the wiring is constructed.

A method in which a pattern of wiring and connecting holes (via holes) or contact holes is formed on an insulating film and then a barrier layer is formed, a copper (Cu) film is embedded in the pattern concavities and the excess copper film is removed by CMP (chemico-mechanical polishing) is used for the formation of Cu wiring of this type.

For example, it is proposed in Japanese Unexamined Patent Application Laid Open H10-79389 that, when forming a thin copper film with the CVD method on an insulating film, which has been formed on a substrate, and in which concavities have been established and the copper material of the thin copper film is made to fill the concavities as a method of forming copper wiring, the CVD process should be divided into two parts. A heat treatment which fluidizes the thin copper film which has been formed in the first process should be established between the divided CVD processes.

In the past, the embedding technique where a barrier layer is formed by PVD and a seed film of copper (a base film to provide an electrode for electro-copper plating) is formed by PVD and electroplated with Cu is widely used to form the wiring films of semiconductor devices.

For example, in Japanese Unexamined Patent Application Laid Open H11-135504 there is proposed for the purpose of forming a copper film which has good electro-migration resistance a method for the manufacture of semiconductor devices comprising a process whereby grooves are formed in an insulating film which has been formed over a semiconductor substrate, a process whereby a first copper film is formed in the grooves on the insulating film by sputtering using a target, a process whereby the first copper film is heated and caused to re-flow, a process whereby a second copper film is grown by plating or CVD (chemical vapor deposition) on the first copper film, and a process whereby, on removing by means of CMP the second copper film and the first copper film on the insulating film, at least the first copper film is left behind in the grooves.

Embedding by copper electroplating is widely used as a low cost technique but, as mentioned above, a seed film must be formed beforehand as an electrode. Hence, as the miniaturization of semiconductor devices continues in the future the CVD method which provides good coverage is being put forward as an effective candidate for the formation of the Cu seed films instead of the PVD method.

In recent years it has been recognized that as wiring becomes finer the formation of seed films with the CVD method which provides good coverage has advantages.

In the method disclosed on Japanese Unexamined Patent Application Laid Open H11-135504 referred to earlier, the copper film which has been formed by sputtering is temporarily fluidized by heating (annealing). However, with the need for thinner films in the future there is a problem in that as the Cu seed films which are formed with the CVD method become thinner it is possible that they may agglomerate as a result of this heating (annealing). If agglomeration of the Cu seed film occurs at the formation stage and the base (barrier film) is exposed here and there where there is no film then another problem arises in that voids (gaps) will be present after the subsequent embedding process with copper electroplating.

Furthermore, in the method for the manufacture of semiconductor devices with a process in which a first copper film is formed as a seed film using the CVD method and a second thin copper film is formed by plating using the first copper film as an electrode, for example, there has been a problem in the past in that the adhesion of the Cu layer which forms the interface with the base film for diffusion barrier purposes such as TiN is poor. Consequently, problems have arisen with the fact that peeling of the Cu film from the base film for diffusion barrier purposes such as TiN has inevitably occurred. In the polishing process (CMP Process) after forming a copper wiring film with the CVD method.

OBJECTS AND SUMMARY

Thus, the present invention is intended to provide a method for the formation of copper wiring films which makes the most of the advantages of the CVD method which provides good coverage with which, while forming the thin copper film which forms the seed film by means of the CVD method, the adhesion of the thin copper film which is formed by CVD and the base film for diffusion barrier purposes can be improved easily using the technique known as seed film annealing.

In order to resolve the aforementioned problem, a method for the formation of copper wiring films, comprises the steps of forming a first copper film by means of a CVD method on an insulating diffusion barrier film; heating the first copper film to a temperature within the range from 200 to 500° C.; and subsequently forming a second copper film on the first copper film by a plating method using the first copper film as an electrode.

Another method for the formation of copper wiring films comprises the steps of forming a first copper film on an insulating diffusion barrier film; forming a second copper film on the first copper film by a plating method using the first copper film as an electrode; and heating the first copper film to a temperature within the range from 200 to 500° C.

Here, the heating temperature in the heating (annealing) process is set within the range from 200 to 500° C. because the copper film deposition conditions with the CVD method generally include a temperature of about 200° C. and if it is not heated to a temperature above this level then the adhesion-improving effect brought about by the inclusion of the heating (annealing) process is unsatisfactory, while if the temperature exceeds 500° C. there is a risk of heat causing damage to the substrate, and this is undesirable.

Moreover, a heating temperature within the range from 350 to 450° C. is more desirable as a better improvement in adhesion can then be attained by the heating (annealing) process.

If, in the aforementioned copper wiring film forming method of the invention, the atmosphere in the heating (annealing) process is at a pressure of at least 10 KPa then there is no fluidization or agglomeration on heating (annealing) under the aforementioned temperature conditions of 200 to 500° C. and the adhesion can also be improved.

If a second heating (annealing) process is carried out after the second copper wiring film forming process in the aforementioned copper wiring film forming method of the present invention then the reliability of the wiring is increased and, moreover, there is a further advantage in respect of the improvement in adhesion.

Furthermore, the thickness of the first copper film which is formed in the first copper film forming process in the aforementioned copper wiring film forming method of this invention is preferably not more than 100 nm.

The first copper film is known as the so-called seed film, and it is made as thin as possible from the viewpoint of cost provided that it has sufficient thickness to function as an electrode for the subsequent electroplating process, and generally it has a thickness of from 20 nm to about 100 nm since this is advantageous in terms of the production costs.

Thus it is possible to improve adhesion without fluidization or agglomeration even if the first copper film is thin at not more than 100 nm as indicated above by means of a first heating process which is carried out at a heating temperature within the range (from 200 to 500° C.) used in the copper wiring film forming method of this invention (and most desirably at a temperature of from 350 to 450° C.), and preferably by means of a first heating process in the aforementioned temperature range which is carried out in an atmosphere at a pressure of at least 10 Kpa.

DETAILED DESCRIPTION OF THE PREFERRED EMBODIMENTS

Figure 1:
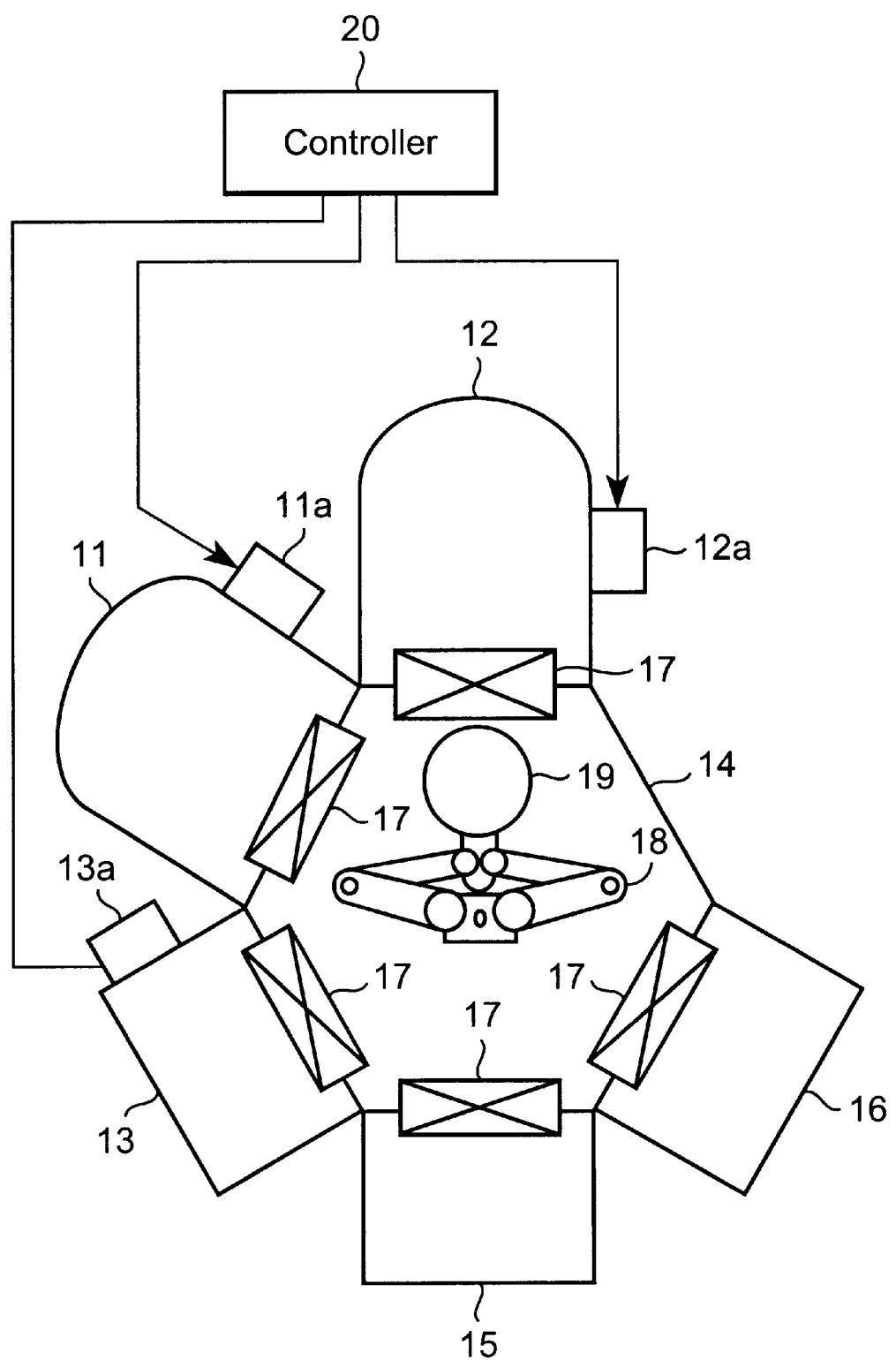
FIG. 1 is a drawing which shows the outline construction of an example of a copper wiring film forming apparatus which can be used in the method for the formation of copper wiring films of this invention.

An example of a copper wiring film forming apparatus, in which the copper wiring film forming method of this invention can be used is shown in FIG. 1.

The apparatus shown in FIG. 1 is an example of a system in which a TiN film 3 as a base film for diffusion barrier purposes is deposited by MOCVD (metal organic chemical vapor deposition) on an insulating film 2 which has been formed on a semiconductor substrate 1, and in which concavities have been established. A first copper film 4 is formed on this film by means of CVD and then proceeds as far as the process in which the first copper film 4 is heated (annealed).

In this case, the insulating film 2 may be an organic film with a low dielectric constant. Moreover, the base film for diffusion barrier purposes is not limited to being a TiN film, and it may be a film of, for example, Ta, TaN, WxN, or a high melting point metal film such as TiSiN, for example. The method whereby the base insulating film for diffusion barrier purposes is formed is not limited to the CVD method. It may be formed by sputtering. Furthermore, the base film for diffusion barrier purposes may be treated with a hydrogen or Ar plasma, for example, after formation in order to improve the film quality.

The copper wiring film forming apparatus shown in FIG. 1 is constructed in the form of multi-chamber apparatus as an example, and it has a separation chamber (transfer chamber) 14 in which a transfer robot (substrate transferring mechanism) 18 is in the center. The apparatus further includes three process chambers, e.g., a TiN for diffusion barrier purposes CVD chamber 11, a copper film CVD chamber 12, and an anneal chamber 13, arranged around the separation chamber 14, along with two load/unload lock/unlock modules 15 and 16. Each chamber is furnished with a gate valve 17.

Here, the term "module" signifies a functional part comprising apparatus, mechanism and system. Hence, the three aforementioned process chambers (the TiN for diffusion barrier purposes CVD chamber 11, the copper film CVD chamber 12, and the anneal chamber 13) are constructed, of course, as modules, and the term chamber is used as a term which indicates the locations at which these processes are carried out.

The transfer robot (substrate transferring mechanism) 18 is established inside the separation chamber 14 and the transfer robot 18 transfers the substrate 19 into and out of each chamber with a hand. In the apparatus described above a single substrate 19 which has been set in a cassette (not shown in the drawing) is transferred from the load module 15 on the left hand side in the drawing into the separation chamber 14 by means of the transfer robot 18.

Figure 2A:
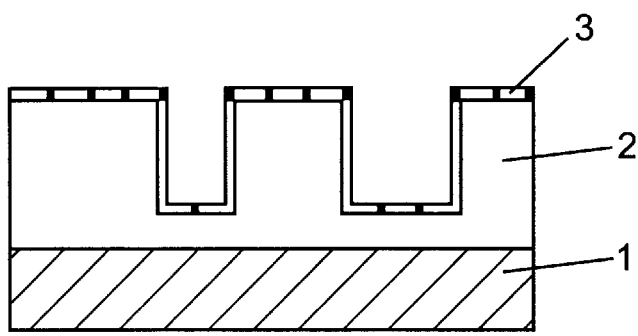
FIG. 2 is a drawing for explaining the processes of the method for forming copper wiring films of this invention where (a) is a part cross sectional drawing of the state where the base film for diffusion barrier purposes has been formed on an insulating film which has been formed on a semiconductor substrate and in which concavities have been established, (b) is a part cross sectional drawing of the state where the first copper film has also been formed, (c) is a part cross sectional drawing which describes the state in which the heat treatment is carried out, and (d) is a part cross sectional drawing of the state where the second copper film has been formed.
Figure 2B:
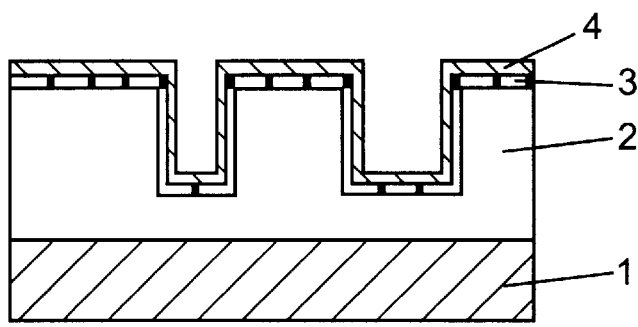
Figure 2C:
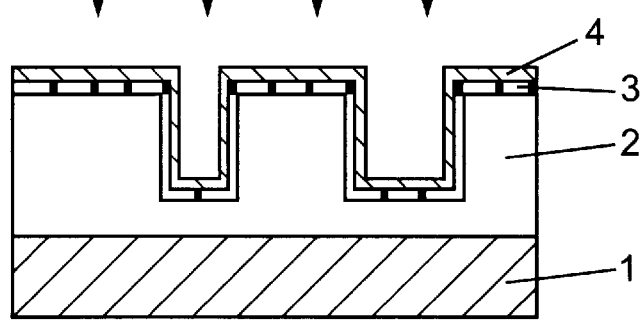
Figure 2D:
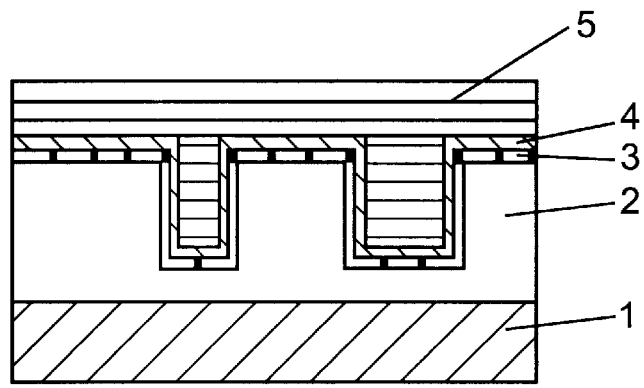

The designated process is carried out in each of the TiN for diffusion barrier purposes CVD chamber 11, the copper film CVD chamber 12 and the anneal chamber 13, and the TiN film 3 is deposited using the MOCVD method as a base film for diffusion barrier purposes on the insulating film 2 which has been formed on the semiconductor substrate 1 in which concavities have been formed, the first copper film 4 is formed over this using the CVD method, and then a process in which the first copper film 4 is heated (annealed) is carried out, as shown in FIG. 2(c), and then the substrate 19 which has been subjected to this series of operations is returned by the transfer robot 18 to the unload module 16 and transferred out. Each of the process chambers in the construction outlined above is described in a little more detail below.

The TiN for diffusion barrier purposes CVD chamber 11, the copper film CVD chamber 12, and the anneal chamber 13 are furnished respectively with vacuum pumping mechanisms 11a, 12a, and 13a. The interior of each chamber is maintained in a suitably reduced pressure state, which is to say in the prescribed vacuum state, by means of the vacuum pumping mechanisms 11a, 12a, and 13a. The operation of the vacuum pumping mechanisms 11a, 12a, and 13a is controlled by a controller 20.

The TiN for diffusion barrier purposes CVD chamber 11, the copper film CVD chamber 12, and the anneal chamber 13, each have a substrate supporting mechanism (not shown in the drawing) on which the substrate 19 which has been transferred to the process chamber by the transfer robot 18 is supported, established in the process chamber. A substrate heating mechanism (not shown in the drawings) which can heat the substrate 19 to the prescribed temperature for the execution of each process is also established in each process chamber.

The gas (Ar is used in the main, but $N_2$ and $H_2$ can also be used) which is used in the anneal chamber 13 is delivered into the anneal chamber 13 by means of a gas supply system which is constructed in the main from an MFC (mass flow controller) and pipe-work. Moreover, the mass flow rate control of the process gas which is used in the other chambers is also carried out by the controller 20.

The Cu wiring film forming method of this invention is, as mentioned earlier, characterized by a sequence of processes whereby the substrate 19 is transferred sequentially to the TiN for diffusion barrier purposes CVD chamber 11, the copper film CVD chamber 12, and the anneal chamber 13. The TiN film for diffusion barrier purposes 3 is deposited, then the first copper film 4 is deposited and then the first copper film 4 is subjected to an annealing process. An example of the conditions for each of these processes which are carried out using the apparatus shown in FIG. 1 are described below.

First of all, a TiN CVD deposition process, to provide the state shown in FIG. 2(a) in which the TiN film 3 is deposited by MOCVD as a base film for diffusion barrier purposes on an insulating film 2 which has been formed on the semiconductor substrate 1 and in which concavities have been established, is carried out using the TiN for diffusion barrier purposes CVD chamber 11. The pressure in the TiN for diffusion barrier purposes CVD chamber 11 is, for example, from 0.1 to 15 Pa, and the chamber 11 is heated in such a way that the temperature of the substrate 19 is from about 300 to 400° C. In this state TDAAT (tetrakisdialkylaminotitanium) as the source gas is supplied at a rate of from 0.004 to 0.2 g/min, for example. At this time, a carrier gas (Ar: argon) is supplied at a mass flow rate within the range from about 0.05 to 3.0 g/min (about 30 to 170 ml/min) in order to improve the flow of source gas in the pipe-work. The addition gas ($NH_3$: ammonia) is supplied at a mass flow rate within the range from 0.76 to 380 mg/min, for example. A diffusion barrier film 3 of film thickness 10 nm is deposited under the abovementioned conditions (FIG. 2(a)).

Next, the substrate 19, with which the abovementioned TiN CVD deposition process has been completed, is transferred into the thin copper film CVD chamber 12. There, a thin copper film deposition process, in which the first copper film 4 is formed by means of CVD on the TiN film 3 as a base film for diffusion barrier purposes to provide the state shown in FIG. 2(b), is carried out. The pressure inside the copper film CVD chamber 12 is maintained at 1.0 KPa, for example, and the temperature of the substrate 19 is set to about 170° C. The deposition of the first copper film 4 is carried out under these conditions using Cu(hfac)(tmvs) (copper(I) trimethylvinylsilylhexafluoroacetylacetonate) as the source gas (FIG. 2(b)).

The substrate 19, with which the first copper film 4 deposition process has been completed, is transferred into the anneal chamber 13. There, an annealing process, in which the first copper film 4 is heated (annealed) is carried out, as shown in FIG. 2(c). The annealing process is carried out, for example, under conditions where argon gas (Ar) is delivered into the anneal chamber 13 and the internal pressure is maintained at from 0.008 to 40 KPa. The gas which is used may be nitrogen ($N_2$) or hydrogen, rather than Ar, and mixtures of two or more types of gas can also be used. The temperature of the substrate 19 is from 300 to 400° C., and the heating time is, for example, 30 minutes (FIG. 2(c)).

Here, the processes up to the anneal chamber 13, which is to say the processes up to the formation of the first copper film 4 on the diffusion barrier film, are preferably carried out consecutively in a vacuum environment without exposing the substrate 19 to air during the treatment. However, the substrate 19 on which the first copper film 4 has been formed may be exposed to air before the annealing process. In fact, a similar effect has been obtained in cases where the vacuum is discontinued after forming the first copper film 4 and the substrate is exposed temporarily to the air and the anneal is then carried out in an electric furnace.

In this case, since the annealing process is preferably carried out with a treatment time of at least 10 minutes, it is possible to improve productivity by carrying out the treatment in an electric furnace in which a plurality of substrates can be treated at the same time.

EXAMPLE OF TESTING

The fact that there was no agglomeration, and the adhesion between the copper film which had been formed by the CVD method to the base film for diffusion barrier purposes was improved easily using the technique known as seed film annealing, was confirmed by the example of testing described below.

First of all the annealing conditions for obtaining good adhesion, using the apparatus shown in FIG. 1, were investigated.

The strength of adhesion was evaluated by taking thick Cu seed films (film thickness>450 nm) which had been deposited in the copper film CVD chamber 12 in order to clarify the relationship with the state of the interface between the diffusion barrier base film and the Cu seed film and to clarify differences in the tape test for adhesion evaluation.

The evaluation of adhesion was made using a tape test method in which cuts to provide 100 squares in a 10 mm square were made in the surface of the thin copper film obtained by means of the processes described earlier (the first thin copper film 4) and then cellophane tape was stuck over the squares and peeled off, and the relationship of the adhesion with the annealing temperature and the Ar pressure during the heating (annealing) process was investigated. The adhesion is indicated by the proportion of squares which did not peel off, and this is indicated as the average value for three measurements.

As mentioned earlier, peeling of the Cu film inevitably occurs in the CMP process (chemico-mechanical polishing method) used to form wiring with Cu since the adhesion is poor. A rough guide to durability in the CMP process is provided with a means of evaluation using such a tape test. Thus, with an adhesion of 0% Cu peeling will occur almost certainly in the CMP process, while peeling is unlikely to occur with an adhesion of 80% or above.

First of all, the effect on the adhesion of changing the annealing temperature with a fixed annealing pressure (=1.3

KPa) in the anneal chamber 13 shown in FIG. 1 was investigated. The results obtained are shown in Table 1.

TABLE 1

| Annealing Temperature (° C.) | Ar Pressure (KPa) | Adhesion (%) |
|---|---|---|
| No Anneal | — | 0 |
| 300 | 1.3 | 0 |
| 320 | 1.3 | 0 |
| 350 | 1.3 | 0 |
| 400 | 1.3 | 30 |

The results shown in Table 1 confirm that the adhesion improving effect starts to appear at the highest temperature of 400° C. among the annealing temperature for which the measurements were made when the annealing temperature was raised to up to 400° C. as an annealing temperature which does not result in substrate damage as a result of heat.

Next, the effect on adhesion when the annealing pressure was changed with the annealing temperature set to 400° C. on the basis of the results shown in Table 1 were investigated. The results are shown in Table 2.

TABLE 2

| Annealing Temperature (° C.) | Ar Pressure (KPa) | Adhesion (%) |
|---|---|---|
| No Anneal | — | 0 |
| 400 | 1.3 | 30 |
| 400 | 13 | 97 |
| 400 | 26 | 99 |
| 400 | 35 | 99 |
| 400 | 40 | 100 |

It is clear from the results shown in Table 2 that when the anneal is carried out at pressures of 13 KPa and above the adhesion is greatly improved to at least 97%, and it is confirmed that the strength of adhesion is increased. Moreover, there is no change in color or whitening of the surface of the copper film and the metallic luster is retained. The following embodiment was completed on the basis of these results.

Embodiment

A Cu seed film (the first copper film indicated by the number 4 in FIG. 2) was formed with a film thickness of 30 nm as a structure approaching that of an actual semiconductor device using the copper wiring film forming method of the invention, and verification of the increased adhesion with a sample where this film was used as the electrode for copper electroplating was carried out.

The sample for adhesion evaluation purposes was obtained using the apparatus shown in FIG. 1 (described earlier) with treatment under consistent vacuum conditions in the TiN for diffusion barrier purposes CVD chamber 11 and the copper film CVD chamber 12, and then using an electric furnace for the annealing process.

The annealing conditions in the electric furnace were 13 KPa under an Ar gas atmosphere with an annealing temperature of 400° C. and an annealing time of 30 minutes.

Subsequently, a second copper film (number 5 in FIG. 2) was formed by copper electroplating using the Cu seed film (first copper film, number 4 in FIG. 2) which had been annealed in the electric furnace as the electroplating electrode and embedded in the concavity of the substrate 19 (FIG. 2(*d*), film thickness: 900 nm) to provide a sample for adhesion evaluation purposes.

Any copper electroplating bath can be used in the second copper film 5 forming process and a copper sulfate bath is generally used. In this embodiment a copper sulfate bath was used to form the second copper film 5.

Tape tests were carried out in the same way as in the aforementioned example of testing with the sample for adhesion evaluation purposes which had passed through each of the abovementioned processes and good results were obtained with no peeling of the copper film.

Furthermore, a sample for evaluation purposes which had been subjected to a second heating (annealing) process after embedding the copper in the concave parts of the substrate 19 by means of the aforementioned processes (FIG. 2(*d*), film thickness: 900 nm) and forming the copper wiring film was prepared and the same tape test as that used in the aforementioned example of testing was carried out using this sample. The sample preparation process used for the adhesion evaluation sample on this occasion and the results of the adhesion evaluation are shown in Table 3.

TABLE 3

| TiN for Diffusion Barrier Purposes CVD Process | Copper Film (Seed) CVD Process | Annealing Process | Copper Electroplating Process | Annealing Process | Adhesion (%) |
|---|---|---|---|---|---|
| ® | ® | ® | ® | ® | 100 |

NOTE:
® signifies that the process had been carried out.

The sample for adhesion evaluation purposes which had been prepared with a second heating (annealing) process after the copper electroplating process with a view to improving the stability of the electroplated copper and further improving of the adhesion was evaluated in terms of the adhesion and, as shown in Table 3, there was no peeling at all and good adhesion was confirmed.

This second annealing process is not always necessary to make CMP (chemico-mechanical polishing) possible, but there are cases where improved adhesion is required from the viewpoint of the reliability of the wiring, and in such cases, this is an effective process.

A preferred embodiment of the invention has been described above with reference to the drawings, but the invention is not limited to such an embodiment and it can be modified in various ways within the technical scope which can be understood from the disclosures of the scope of the patent claims.

For example, good adhesion was confirmed when the duration of the annealing process was set to 30 minutes in the example of testing described above where the thickness of the copper film was>450 nm and so it was also set to 30 minutes in the aforementioned embodiment, but in the case of a seed film of thickness 30 nm, which is very thin when compared with that in the example of testing, it is expected that a similar adhesion-improving effect would be obtained with an annealing time shorter than 30 min.

Furthermore, in respect of the annealing temperature the evaluation of adhesion was carried out with an annealing temperature of 400° C. as a temperature below 500° C. at which it is likely that damage to the substrate due to the heat will not arise, but if it is set to 450° C. then a similar effect to that at 400° C. can be expected even if the annealing time is shorter than 30 min. Thus, the setting of the annealing time can be varied according to the thickness of the copper film and the annealing temperature, for example.

By means of the present invention it is possible in a method for the manufacture of semiconductor devices, which includes a process in which a first copper film is formed by means of the CVD method and a process in which a second thin copper film is formed by plating using the first copper film as an electrode by heating the first copper film to a temperature of from 200 to 500° C. between these processes, to increase the adhesion between the base film for diffusion barrier purposes and the aforementioned first copper film which forms the seed copper film without starting to fluidize the afore-mentioned first copper film and with no agglomeration due to the heat.

As a result it is possible to form highly reliable Cu film wiring with which no peeling occurs with CMP (chemico-mechanical polishing) in the semiconductor manufacturing process.

What is claimed is:

1. A method for the formation of copper wiring films, comprising the steps of:

forming a first copper film by means of a CVD method on a diffusion barrier film;

heating the first copper film to a temperature within the range from 200 to 500° C. and in an atmosphere above 10 KPa; and subsequently forming a second copper film on the first copper film by a plating method using the first copper film as an electrode.

2. The method for the formation of copper wiring films according to claim 1, wherein the diffusion barrier film is formed on an insulating film that is formed on a semiconductor substrate, and the diffusion barrier film and the insulating film include a concavity.

3. The method for the formation of copper wiring films according to claim 2, wherein a second heating step is carried out after the second copper film forming step.

4. The method for the formation of copper wiring films according to claim 3, wherein a thickness of the first copper film is not more than 100 nm.

5. The method for the formation of copper wiring films according to claim 2, wherein a thickness of the first copper film is not more than 100 nm.

6. The method for the formation of copper wiring films according to claim 1, wherein a second heating step is carried out after the second copper film forming step.

7. The method for the formation of copper wiring films according to claim 6, wherein a thickness of the first copper film is not more than 100 nm.

8. The method for the formation of copper wiring films according to claim 1, wherein a thickness of the first copper film is not more than 100 nm.

9. A method for the formation of copper wiring films, comprising the steps of:

forming a first copper film on a diffusion barrier film;

forming a second copper film on the first copper film by a plating method using the first copper film as an electrode; and heating the first copper film to a temperature within the range from 200 to 500° C. and in an atmosphere above 10 KPa.

10. The method for the formation of copper wiring films according to claim 9, wherein the diffusion barrier film is formed on an insulating film that is formed on a semiconductor substrate, and the diffusion barrier film and the insulating film include a concavity.

11. The method for the formation of copper wiring films according to claim 10, wherein a thickness of the first copper film is not more than 100 nm.

12. The method for the formation of copper wiring films according to claim 9, wherein a thickness of the first copper film is not more than 100 nm.

* * * * *